United States Patent
Zou et al.

(10) Patent No.: US 9,543,502 B2
(45) Date of Patent: Jan. 10, 2017

(54) SMALL PITCH AND HIGH DENSITY CONTACT ARRAY

(71) Applicant: GLOBALFOUNDRIES Singapore Pte. Ltd., Singapore (SG)

(72) Inventors: Zheng Zou, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 39 days.

(21) Appl. No.: 14/720,856

(22) Filed: May 25, 2015

(65) Prior Publication Data

US 2016/0351791 A1 Dec. 1, 2016

(51) Int. Cl.
| | | |
|---|---|---|
| H01L 43/08 | (2006.01) | |
| H01L 43/02 | (2006.01) | |
| H01L 43/12 | (2006.01) | |
| H01L 27/22 | (2006.01) | |

(52) U.S. Cl.
CPC .............. *H01L 43/02* (2013.01); *H01L 27/222* (2013.01); *H01L 43/08* (2013.01); *H01L 43/12* (2013.01)

(58) Field of Classification Search
CPC ........ H01L 43/02; H01L 43/12; H01L 27/222; H01L 43/08
See application file for complete search history.

(56) References Cited

U.S. PATENT DOCUMENTS

2010/0248491 A1* 9/2010 Sun ..................... H01L 21/0338
438/717

* cited by examiner

*Primary Examiner* — Kyoung Lee
(74) *Attorney, Agent, or Firm* — Horizon IP Pte. Ltd.

(57) ABSTRACT

A method of forming high density contact array is disclosed. The method includes providing a first dielectric layer and forming a hard mask stack over the first dielectric layer. The hard mask stack includes first, second and third hard mask layers. The first and second hard mask layers are processed to form high density array of hard mask stack structures using a double patterning process. The hard mask stack structures include patterned first and second hard mask layers having a first width F1. The width of the patterned second hard mask layers is reduced to a second width F2 to form high density array of hard mask posts. A fourth hard mask layer is formed over the third hard mask layer and surrounding the hard mask posts. The hard mask posts and portions of the third hard mask layer and first dielectric layer underlying the hard mask posts are removed to form high density contact hole array.

20 Claims, 17 Drawing Sheets

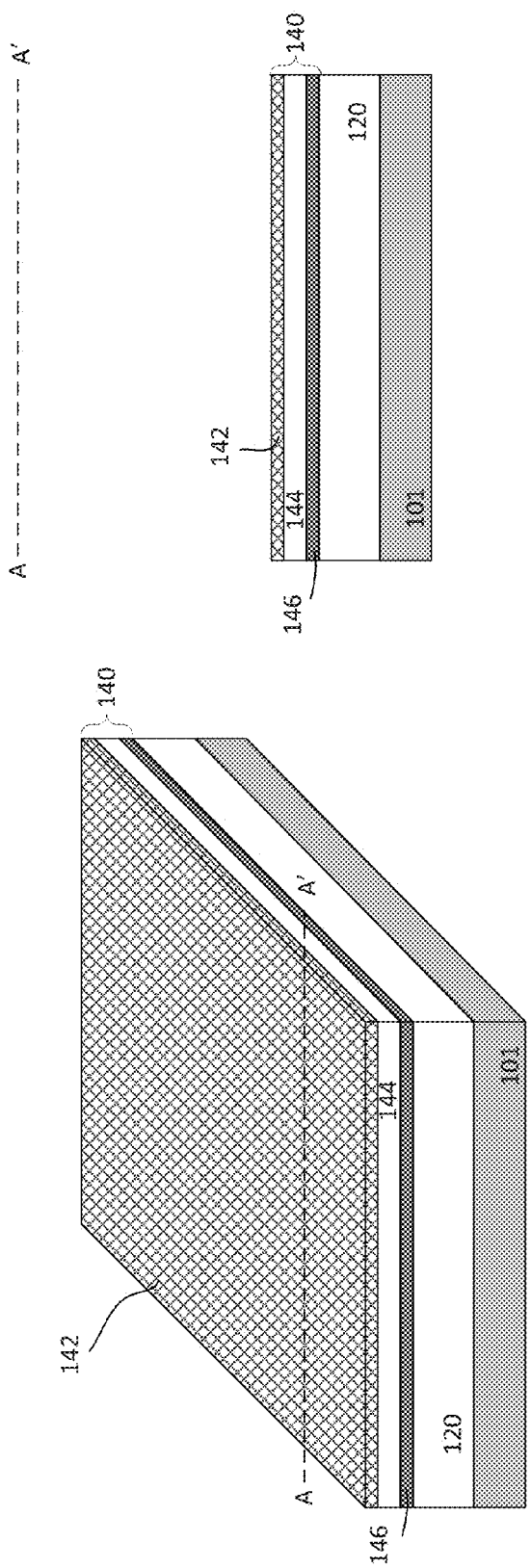

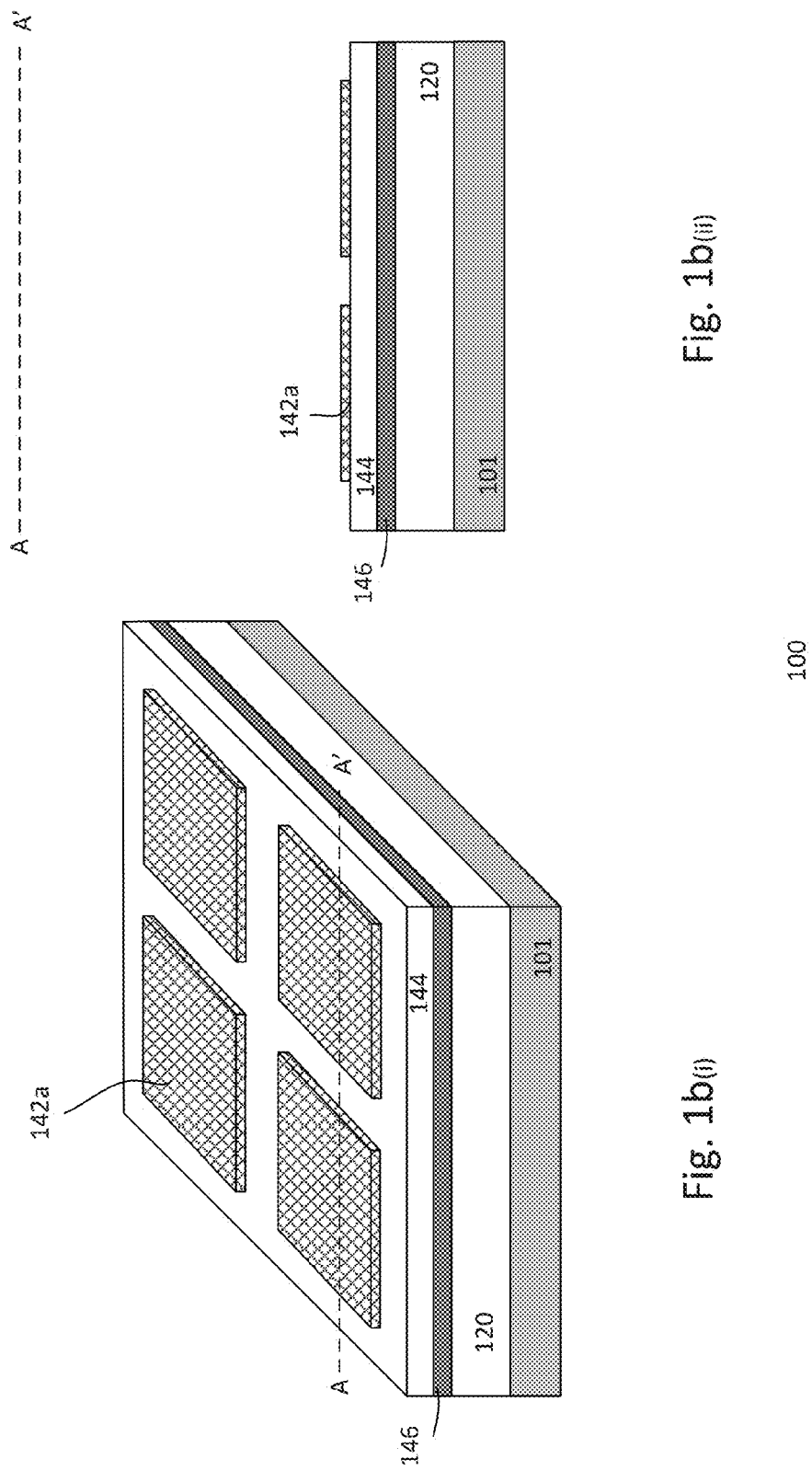

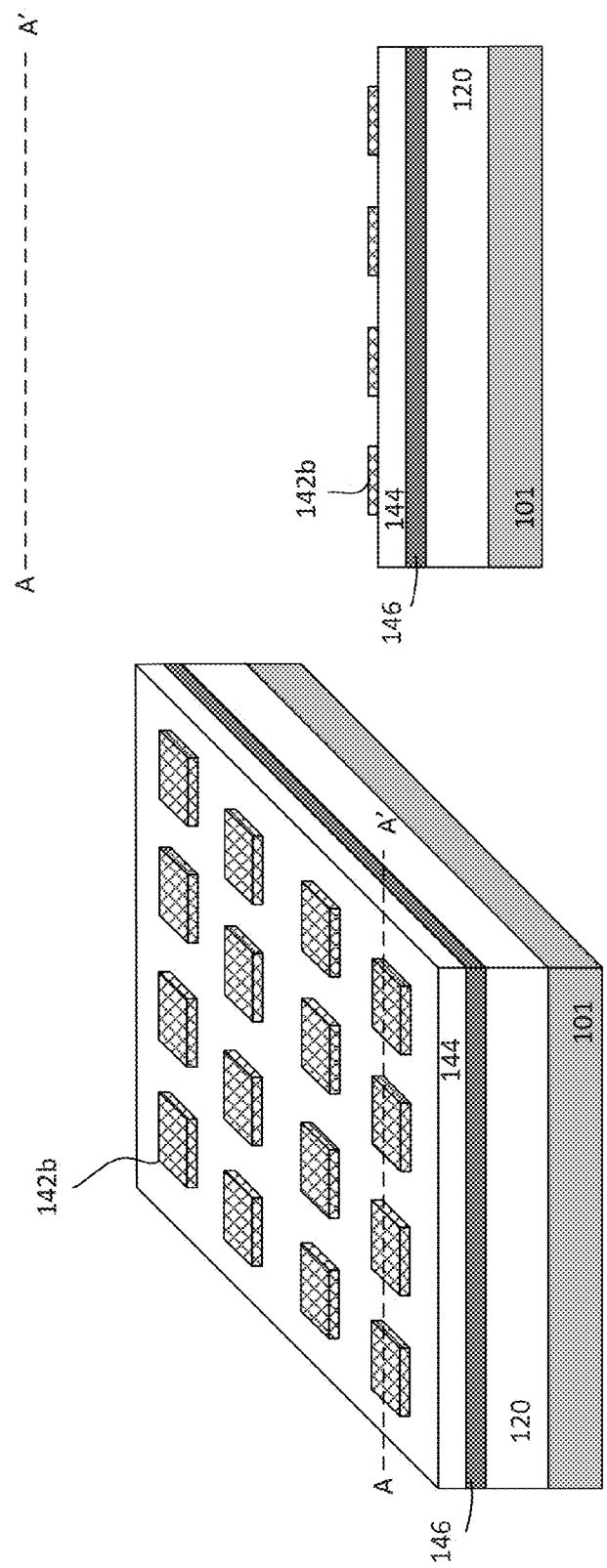

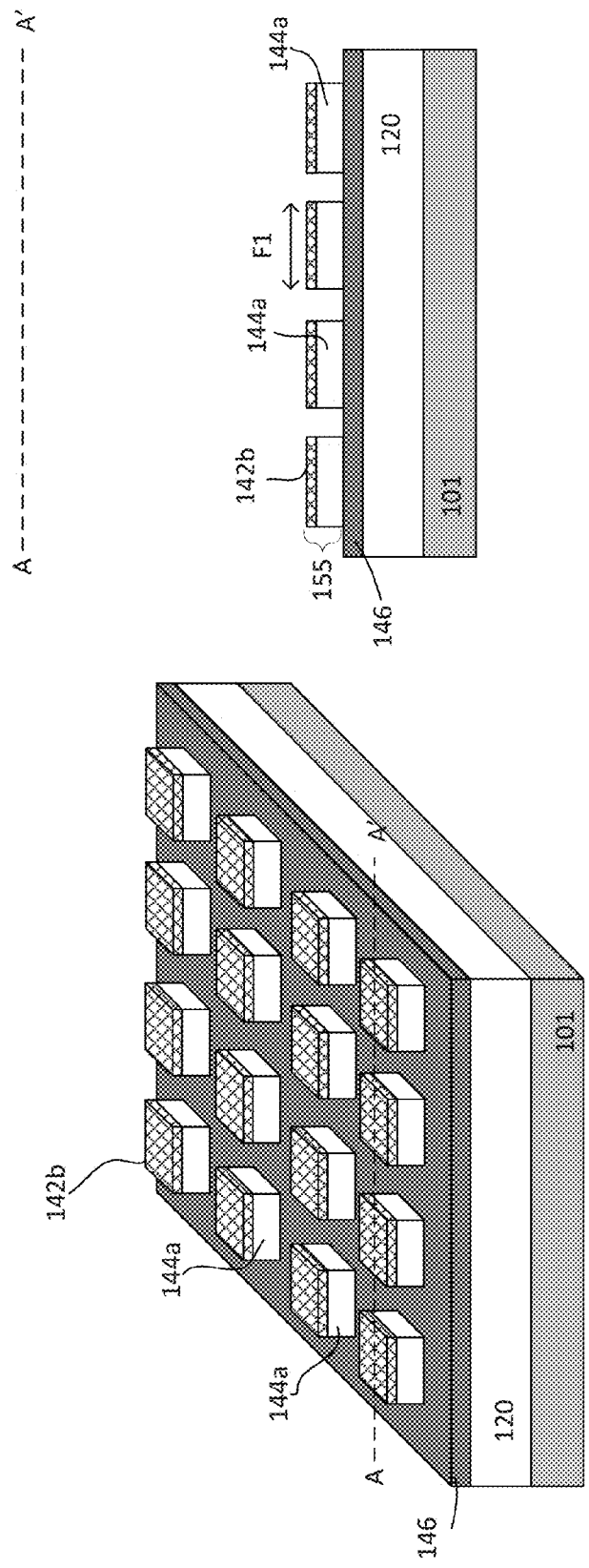

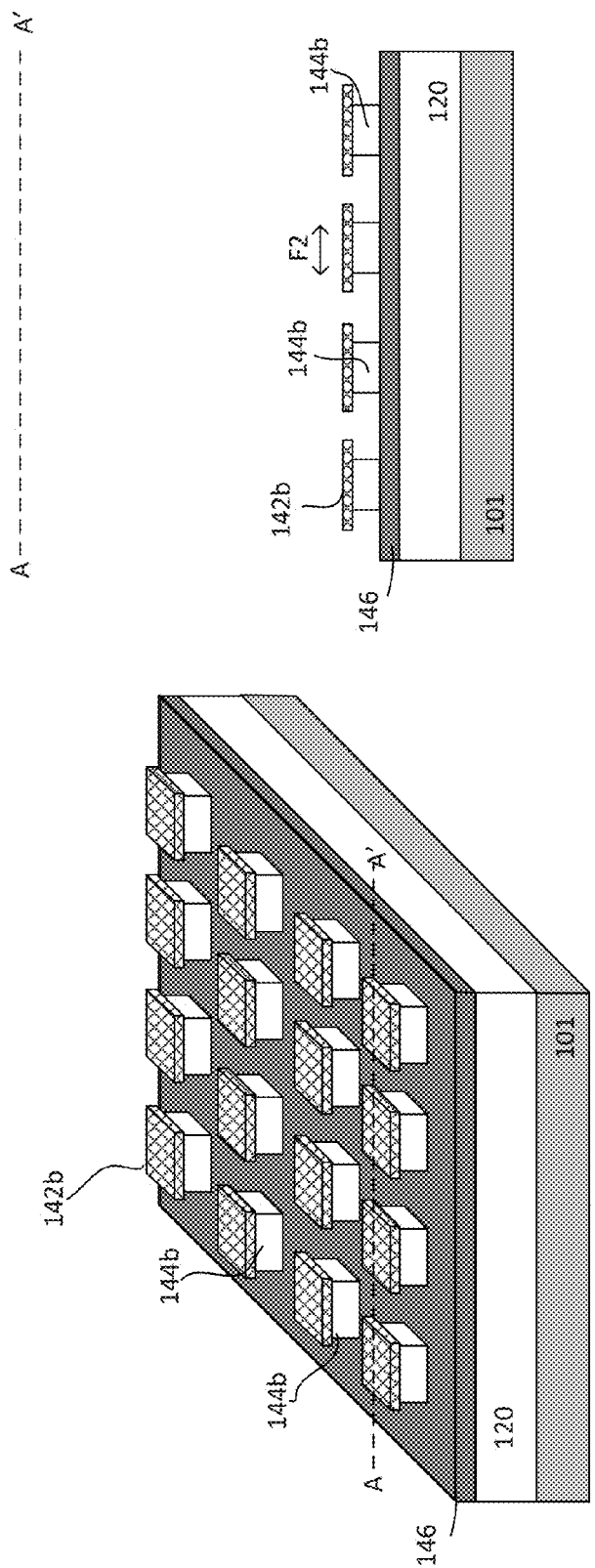

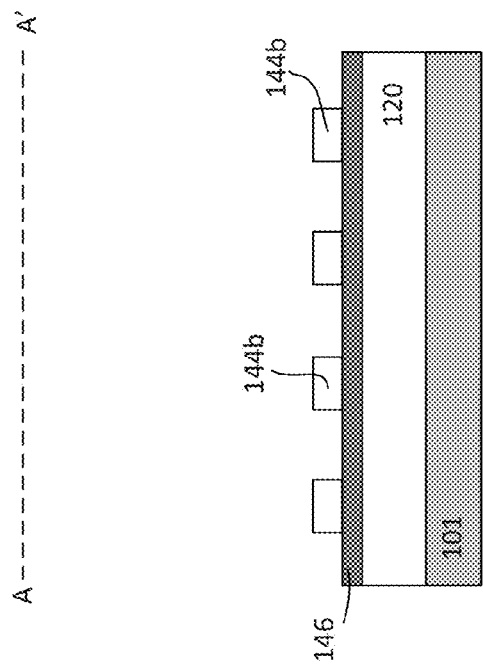
Fig. 1f(ii)
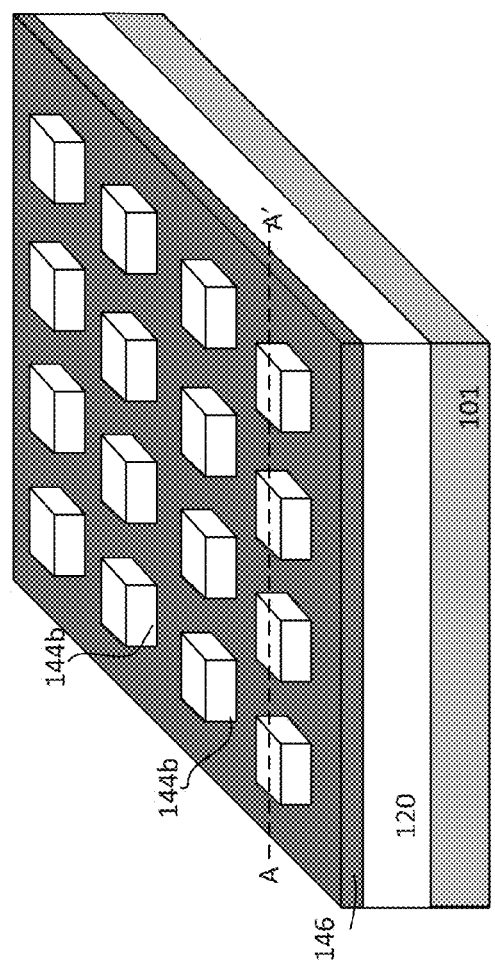
Fig. 1f(i)
Fig. 1f

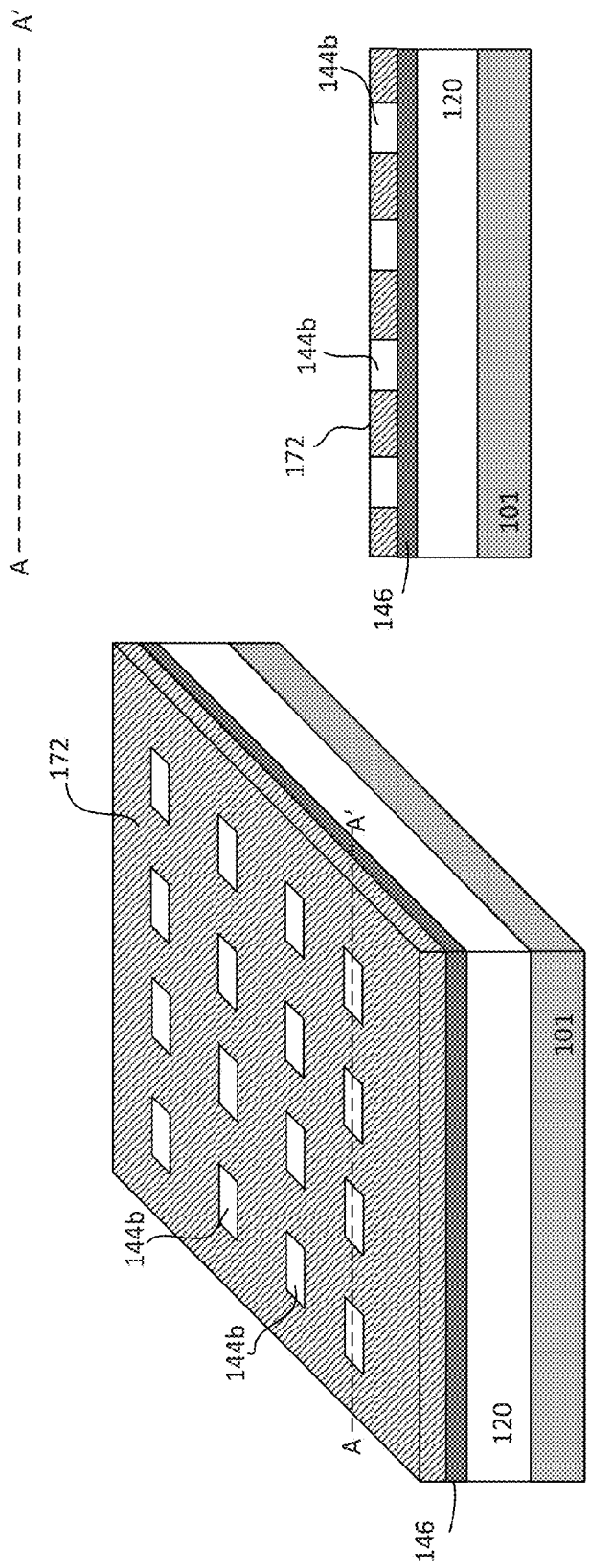

Fig. 1h(ii)

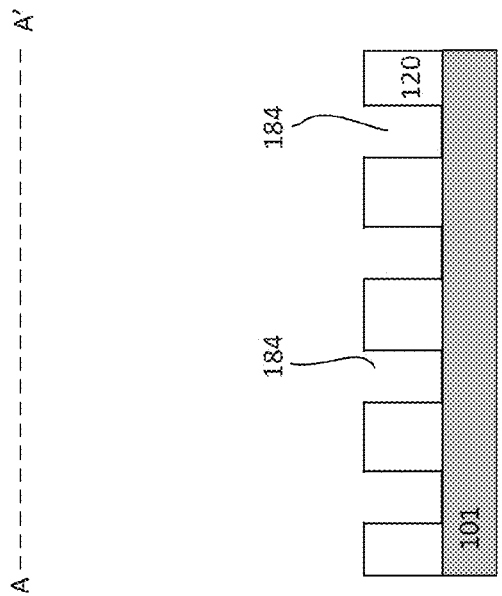
Fig. 1i(ii)
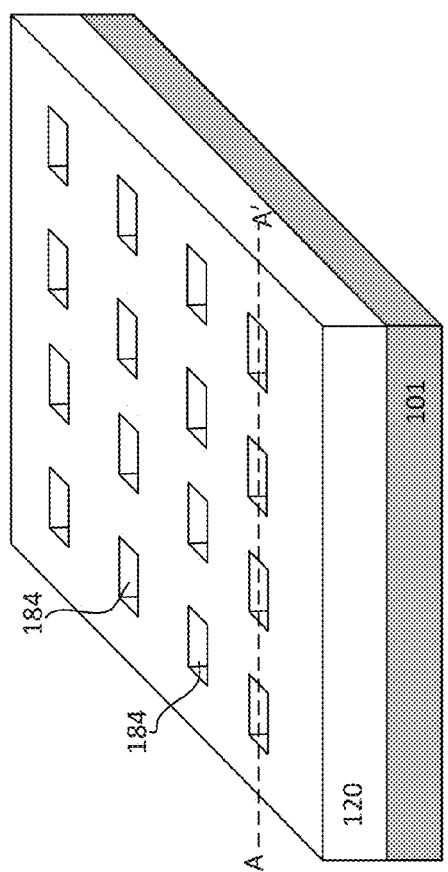
Fig. 1i(i)

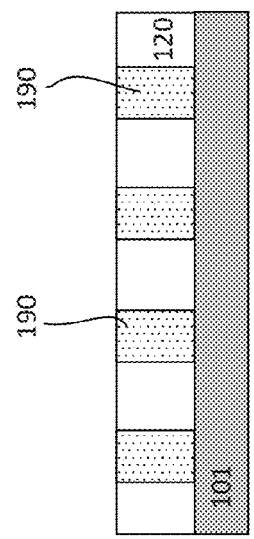
Fig. 1j(ii)
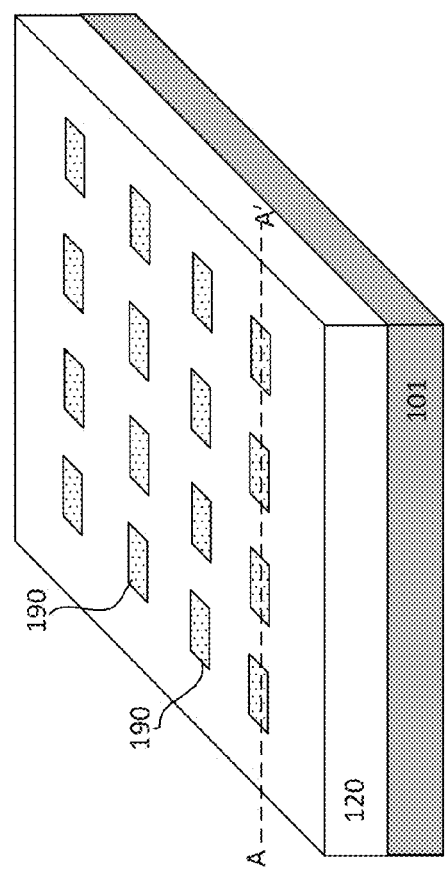
Fig. 1j(i)

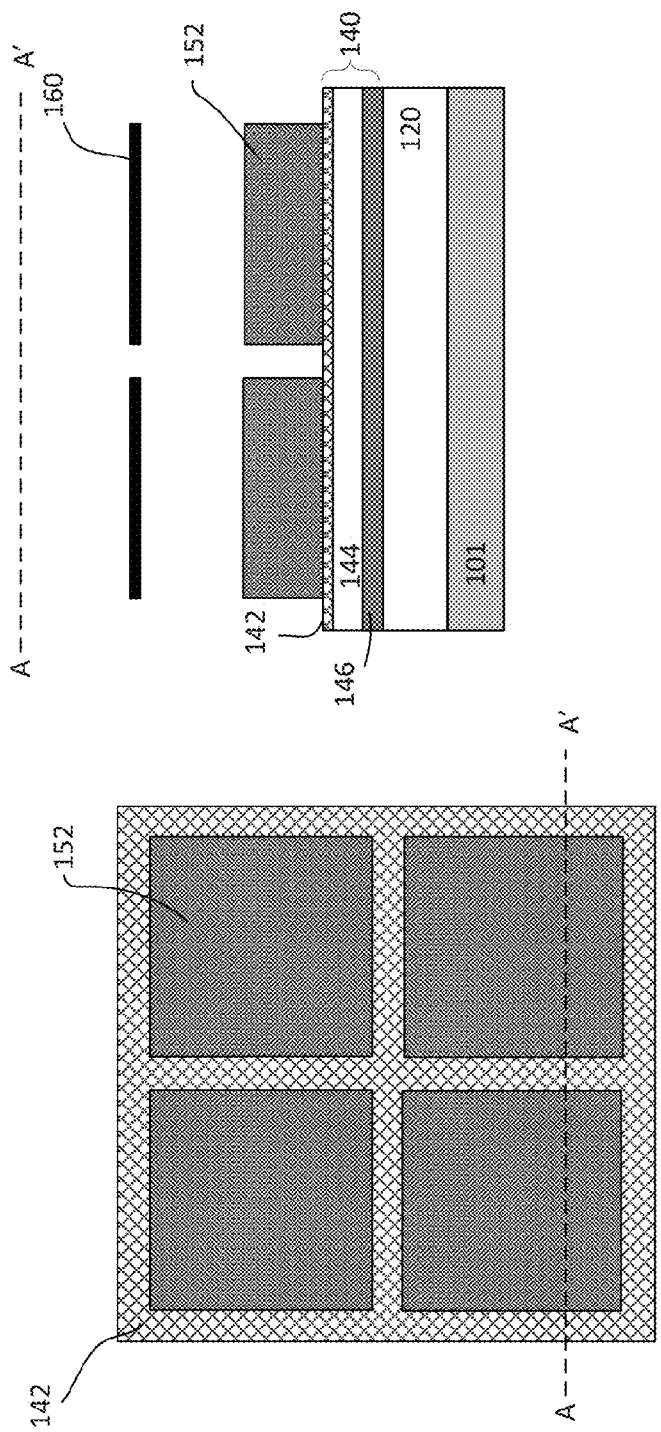

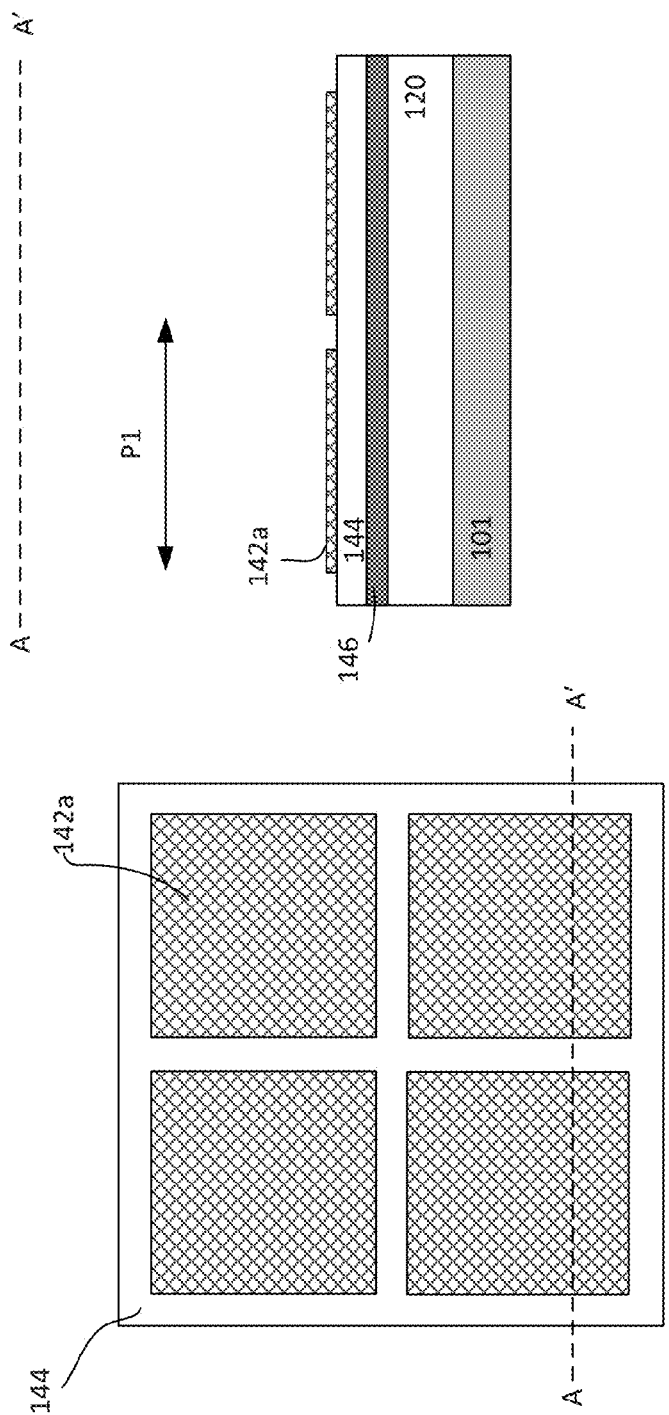

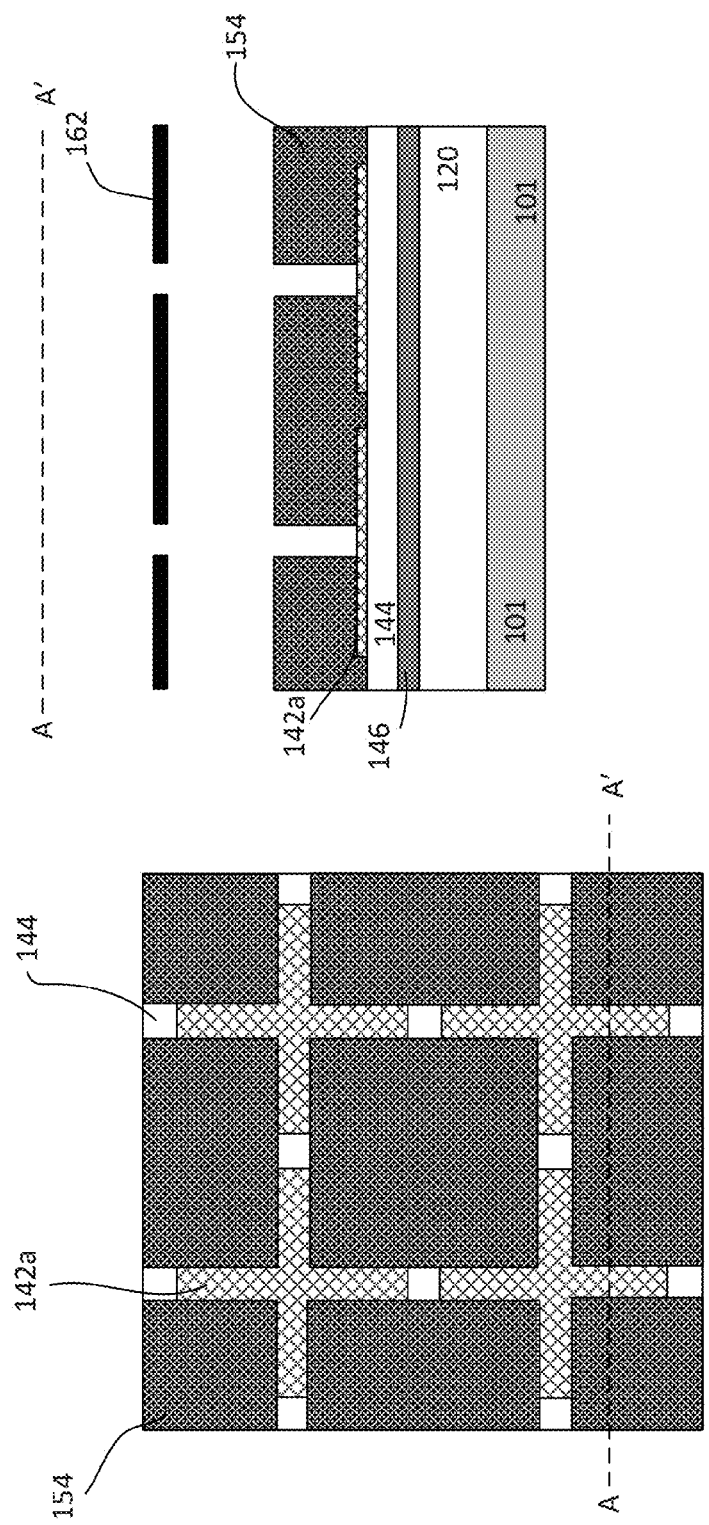

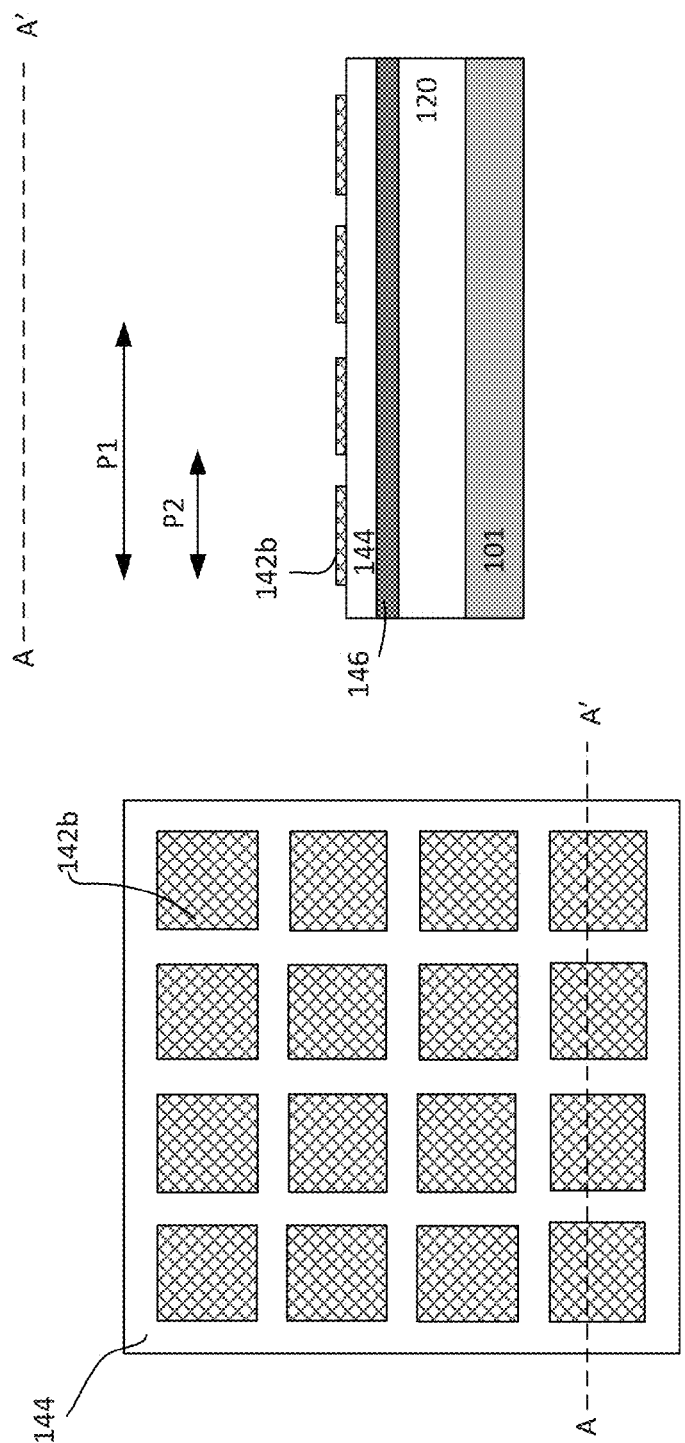

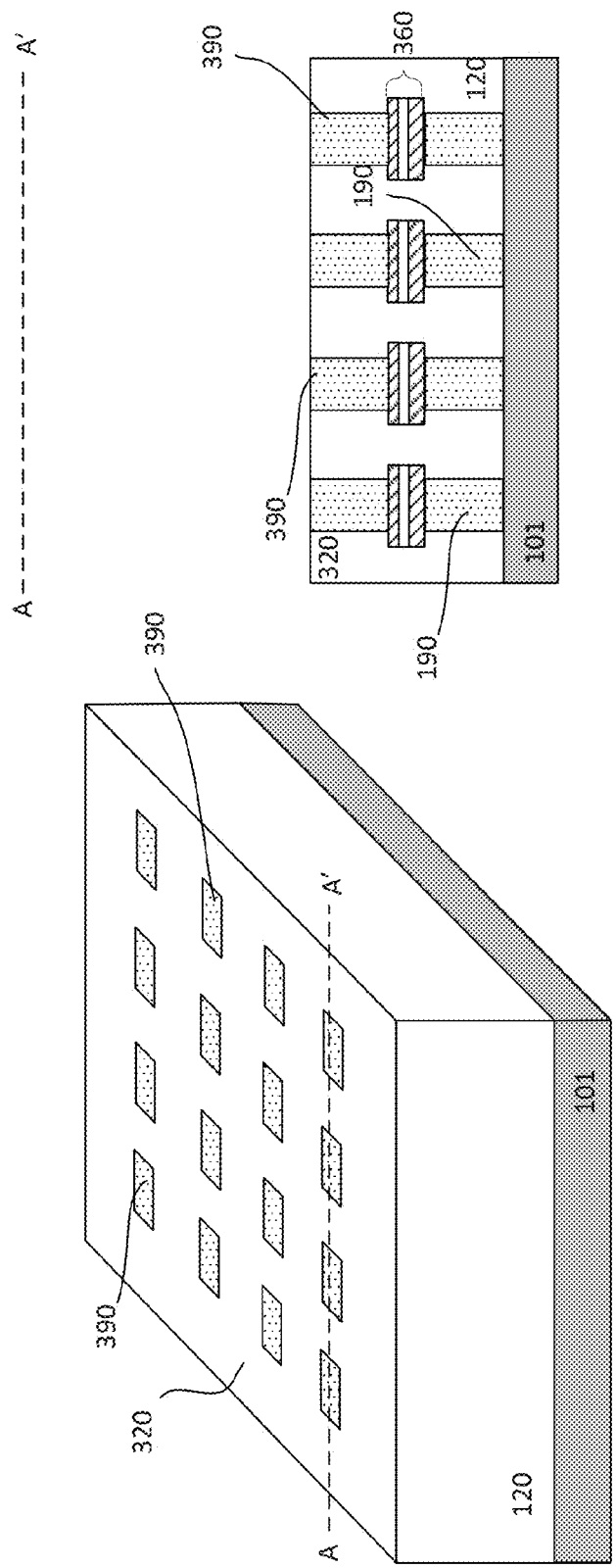

SMALL PITCH AND HIGH DENSITY CONTACT ARRAY

BACKGROUND

It is important to form high density contact holes or via openings in a wafer for some devices. Due to lithography process limitations, however, it is sometimes difficult to create high density contact holes or via openings as desired. For example, in the case of forming contact holes in a dielectric layer, the size or diameter of the contact holes formed by lithography process are relatively large in diameter, such as more than half of the pitch size. This results in low density array of contact holes to be formed, which is not preferred for certain devices. Furthermore, forming small size contact holes is much more challenging than forming small size trenches because of diffraction in both X and Y directions.

From the foregoing discussion, it is desirable to provide high density array of contact holes with small size and dimension in a wafer. There is also a need to provide a simplified and cost efficient method to form these high density array of contact holes.

SUMMARY

Embodiments generally relate to semiconductor device and method for forming a device. A method of forming high density contact array is disclosed. The method includes providing a first dielectric layer and forming a hard mask stack over the first dielectric layer. The hard mask stack includes first, second and third hard mask layers having materials with mutual etch selectivity with each other. The third hard mask layer is formed over the first dielectric layer while the second hard mask layer is formed in between the first and third hard mask layers. The first and second hard mask layers are processed to form high density array of hard mask stack structures using a double patterning process. The hard mask stack structures include patterned first and second hard mask layers having a first width F1. The width of the patterned second hard mask layers is reduced to a second width F2 to form high density array of hard mask posts. A fourth hard mask layer is formed over the third hard mask layer and surrounding the hard mask posts. The hard mask posts and portions of the third hard mask layer and first dielectric layer underlying the hard mask posts are removed to form high density contact hole array.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 1a-1j show an embodiment of a process for forming a portion of a device of which figures with a subscript (i) show 3-D views while figures with a subscript (ii) show cross-sectional views taken at A-A';

FIGS. 2a-2d illustrate an embodiment of double patterning technique of which figures with a subscript (i) show top views while figures with a subscript (ii) show cross-sectional views taken at A-A'; and FIGS. 3a-3c show an embodiment of a process for forming a memory device of which figures with a subscript (i) show 3-D views while figures with a subscript (ii) show cross-sectional views taken at A-A'.

DETAILED DESCRIPTION

Forming small pitch and high density contact holes on a wafer is crucial for certain devices. In conventional semiconductor manufacturing process, the contact holes printed by lithography technique usually have relatively large diameter. For example, the contact holes formed by lithography techniques are generally more than half of the pitch size, thus resulting in low density of contact array to be formed. In addition, forming small size contact holes is more challenging than forming small size trenches due to diffractions in both X and Y directions. Double patterning technique can reduce pitch size for lines significantly. However, double patterning technique may not be applicable to contact holes if the diameter of the contact hole formed by lithography is larger than half of the pitch size.

Embodiments in the present disclosure generally relate to techniques for forming high density array of small size contact holes on a wafer surface. Particularly, the embodiments as will be described later employ double patterning, hard mask pull-back and reverse mask techniques to form small pitch and high density array of contact holes. The high density array of small size contact holes will then be filled with conductive material to serve as high density contact array and can be incorporated into any type of integrated circuits (ICs). The devices or ICs can be incorporated into or used with, for example, consumer electronic products, such as computers, cell phones, personal digital assistants (PDAs) or other suitable type of products.

Figure 1H:
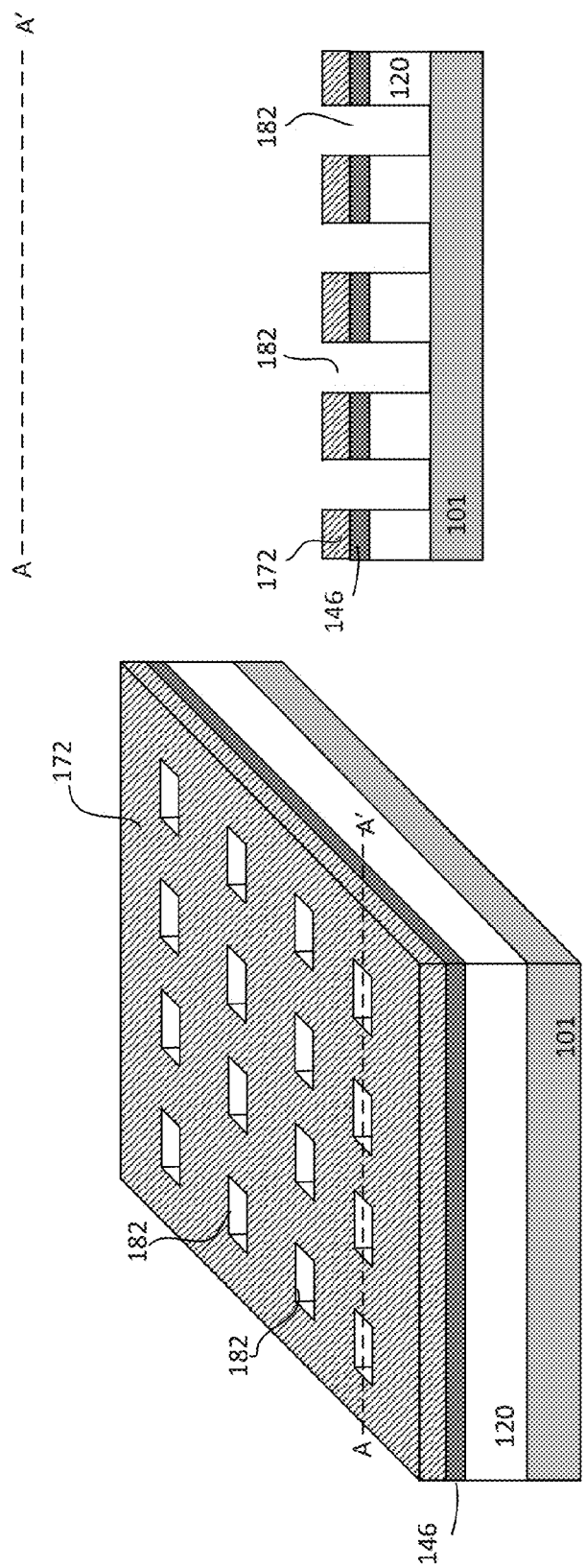

FIGS. 1a-1j show an embodiment of a process 100 for forming a portion of a device of which figures with a subscript (i) show 3-D views while figures with a subscript (ii) show cross-sectional views taken at A-A'. The device, for example, is an IC. Other types of devices may also be useful. Referring to FIG. 1a, a portion of the device is shown. A substrate 101 is provided. The substrate 101 may be, for example, a semiconductor substrate. The semiconductor substrate may be a lightly doped p-type silicon substrate. Other suitable types of substrates, such as a germanium-based, gallium arsenide, silicon-on-insulator (SOI), or sapphire substrate, are also useful.

In one embodiment, the substrate may be an active substrate which includes circuit components (not shown) such as transistors, capacitors or resistors formed thereon with contact regions. Other suitable types of circuit components may also be useful.

In one embodiment, a first dielectric layer 120 is formed on the substrate. The first dielectric layer serves as a layer containing contacts. The dielectric layer may be referred to as a contact dielectric layer. The first dielectric layer, for example, may be a pre-metal dielectric (PMD) layer formed on the substrate over the active components. In other embodiments, the first dielectric layer may be located at other levels of the device. For example, the substrate may include one or more metal levels below the first dielectric layer. Other configurations of substrate and/or first or contact dielectric layer may also be useful. For example, the substrate may include multiple contact dielectric layers at different levels of the device.

In one embodiment, the first or contact dielectric layer is formed of silicon oxide. Other suitable types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the first dielectric layer. The first dielectric layer, for example, may include any suitable thickness, depending on the desired height of contacts which will be formed later.

The first dielectric layer can be deposited using various types of processes. For example, the first dielectric layer is deposited using chemical vapor deposition (CVD), including plasma enhanced (PECVD), high density (HDCVD) or atmospheric pressure (APCVD). Other suitable techniques, such as spin-on processes, depending on the type of material used and application, may also be useful. The first dielectric layer, for example, may be silicon oxide formed by PECVD using tetraethylorthosilicate (TEOS) as the main precursor gas. A planarization process, such as a chemical mechanical polishing (CMP), can be performed, if necessary, to provide a planar top surface.

In one embodiment, a hard mask stack 140 is formed over the first dielectric layer 120. The hard mask stack, for example, is a multi-layered hard mask stack. The hard mask stack, in one embodiment, includes first, second and third hard mask layers. Providing other suitable number of layers to form the multi-layered hard mask stack may also be useful.

The various layers of the hard mask stack include respective first and second major surfaces. The first major surface may be referred to as the top major surface while the second major surface may be referred to as the bottom major surface. In one embodiment, the various layers of the hard mask stack include materials having mutual etch selectivity with each other. The first hard mask layer 142 is formed of a first material. The first material, for example, includes a nitride material, such as but not limited to SiN. The second hard mask layer 144 is formed below the second major surface of the first hard mask layer. The second hard mask layer, for example, is formed of a second material which the first material can be etched with selectively to it. For example, the second material includes an oxide material, such as but not limited to silicon oxide. The third hard mask layer 146 is formed below the second major surface of the second hard mask layer and is formed over top surface of the first dielectric layer 120. The third hard mask layer includes a third material which the second material can be etched selectively to it. For example, the third material includes amorphous carbon material, such as an advanced patterning film (APF). Any other suitable types of materials may also be used for the first, second and third hard mask layers so long as they provide etch selectivity with each other.

The various layers of the hard mask stack 140 are sequentially formed over the top surface of the first dielectric layer 120. In one embodiment, the various layers of the hard mask stack are formed by CVD. Other suitable forming or deposition techniques may also be useful. The various layers of the hard mask stack should be sufficiently thick to serve as etch stop and/or to provide protection to the underlying layer(s) during subsequent processing.

The process continues to form high density array of hard mask stack structures 155 (e.g., shown in FIG. 1d). A hard mask stack structure 155, for example, includes patterned first and second hard mask layers. The high density array of hard mask stack structures, in one embodiment, are formed by double patterning technique as presented in FIGS. 2a-2d which will be described below.

FIGS. 2a-2d illustrate an embodiment of a double patterning process. Figures with a subscript (i) show top views while figures with a subscript (ii) show cross-sectional views taken at A-A'.

Referring to FIG. 2a, a first lithographic process of the first patterning process is performed. The first lithographic process includes depositing a first photoresist layer 152 over top surface of the first hard mask layer 142. To improve lithographic resolution, an anti-reflective coating (ARC) may be provided under the first photoresist layer. For example, the ARC (not shown) is disposed between the hard mask layer and photoresist layer. A lithographic system exposes the first photoresist layer using a reticle 160 having a desired pattern. For example, the lithographic system generates a light beam, such as a deep ultraviolet (DUV) beam, having the pattern of the reticle to expose the photoresist layer. After exposure and development, the pattern of the reticle is transferred to the first photoresist layer. For example, in the case of a positive resist, exposed portions of the photoresist layer are removed, forming a first patterned resist mask 152 on top of the first hard mask layer 142.

The first patterned resist mask is employed to form features separated by spaces. In one embodiment, the reticle is employed to form line features, separated by spaces. As shown, the line features, for example, are trenches which expose the first hard mask layer below while the spaces are unremoved photoresist. The line features extend in first and second directions, forming a grid with spaces separating the lines.

A line feature has a width and is separated by another line feature by a space. For example, each feature has a feature width separated from an adjacent feature by a space. A width of the feature may be referred to as a feature critical dimension ($CD_f$) while the width of the space may be referred to as a space critical dimension ($CD_s$). The sum of $CD_f$ and $CD_s$ may be referred to as a pitch P1. The pitch P1, for example, may be the minimum pitch size achievable by lithography. In such case, $CD_f$ is the minimum $CD_f$ and $CD_s$ is the minimum $CD_s$. Non-minimum pitch for P1 may also be useful.

The feature width $CD_f$ should be less the P1½. The feature width $CD_f$ should be sufficiently small to enable P1 to occupy at least two features. For example, $CD_f$ may be about ¼ of P1. In one implementation, $CD_f$ is about ¼ of P1 to ⅓ of P1. Other values of $CD_f$ relative to P1 may also be useful.

Referring to FIG. 2b, a first etch is performed using the first patterned resist mask. The etch removes portions of the first hard mask layer unprotected or exposed by the first patterned resist mask 152. For example, the pattern of the resist mask is transferred to the first hard mask layer by the first etch, forming a first patterned hard mask 142a. The first etch may be an anisotropic etch, such as reactive ion etch (RIE). Other types of etch processes may also be useful. The first etch is highly selective to the material of the first hard mask layer. This enables the first etch to stop at the underlying hard mask layer. For example, the first etch stops when it reaches the top surface of the second hard mask layer 144. The first patterned resist mask 152 is removed after the first etch. The first patterned resist mask may be removed by, for example, using ashing or other suitable techniques. This, for example, completes the first patterning process.

As shown, the first patterning process forms first features on the first hard mask separated by first spaces. The first features are first line features. The line features, for example, are trenches which expose the second hard mask layer below while the remaining first hard mask forms the first spaces. Similar to the resist mask, a width of the first feature may be referred to as a first feature critical dimension ($CD_f$) while the width of the first space may be referred to as a first space critical dimension ($CD_s$) with the sum of $CD_f$ and $CD_s$ equal to P1. In one embodiment, the first $CD_s$ is equal to P1-$CD_f$.

In FIG. 2c, the double patterning process continues by performing a second lithographic process. The second lithographic process includes depositing a second photoresist layer 154 over top surface of the patterned first hard mask layer 142a. To improve lithographic resolution, an ARC (not shown) may be provided under the second photoresist layer. A lithographic system exposes the second photoresist layer using a second reticle 162 having a desired pattern. For example, the lithographic system generates a light beam, such as a DUV beam, having the pattern of the second reticle to expose the second photoresist layer. After exposure and development, the pattern of the reticle is transferred to the photoresist layer. For example, in the case of a positive resist, exposed portions of the photoresist layer are removed, forming a second patterned resist mask 154 on the patterned first hard mask layer 142a.

In one embodiment, the second reticle is the same as the first reticle. For example, the same reticle is used for both the first and second lithographic processes. In one embodiment, the reticle is shifted in first and second directions by a pre-determined amount for the second lithographic process. In one embodiment, the reticle is shifted in the first and second directions by ½ pitch. For example, the reticle is shifted ½ pitch in the x direction and ½ pitch in the y direction for the exposure. Shifting the reticle by other suitable distances may also be useful.

The second lithographic exposure using the shifted reticle shifts the line features and spaces onto the photoresist by the predefined amounts in the first and second directions, for example, by ½ pitch in the first and second directions. For example, the second patterned resist mask 154 includes line features disposed between the line features of the first resist mask or first patterned hard mask layer 142a, as shown. The line features expose portions of the first and second hard mask layers.

Referring to FIG. 2d, a second etch process is performed using the second patterned resist mask. The second etch removes portions of the first patterned hard mask layer 142a unprotected or exposed by the second patterned resist mask. For example, the pattern of the second resist mask is additionally transferred to the patterned first hard mask layer 142a by the second etch. The second etch may be an anisotropic etch, such as RIE. Other types of etch processes may also be useful.

The second etch is highly selective to the material of the first hard mask layer. This enables the second etch to stop at the underlying hard mask layer. For example, the second etch stops when it reaches the top surface of the second hard mask layer 144. The second patterned resist mask 154 is removed after the second etch. The second patterned resist mask may be removed by, for example, using ashing or other suitable techniques. This, for example, completes the double patterning process. The resulting features formed from the double patterning process should satisfy design rules.

As shown, the second patterning process forms second line features on the first hard mask. The second line features separate or sever the first spaces into four second spaces. For example, each of the first spaces is separated into four second spaces. The first and second line features are arranged in first and second directions separated by second spaces. The sum of a line feature and a second space forms a pitch P2. The first and second line features have the same $CD_f$ while the second $CD_s$ is smaller than the first $CD_s$. This results in P2 being less than P1. In one embodiment, the second $CD_s$ is equal to ½ P1-$CD_f$. For example, P2 is equal to ½ of P1. The second spaces may be referred to as stools. As shown, the stools are high density stools. For example, the density of the stools is greater than that possible using conventional patterning techniques.

Although two etch processes are described in generating high density stools, it is understood that more than two etch processes in a multi-patterning process may also be used. A multi-patterning process using more than two patterning processes may be similar as that described for double patterning process. For example, additional patterning processes may be provided with additional shifting involved.

Referring back to FIG. 1c, the double patterning process or technique as employed enables the first spaces 142a of the first hard mask as shown in FIG. 1b to be decomposed to second spaces 142b having smaller dimension and pitch. The double patterning technique effectively reduces the pitch and allows for high density structures to be formed.

The process 100 continues to form high density array of hard mask stack structures 155. In one embodiment, the stools 142b are used as etch mask to remove exposed portions of the second hard mask layer 144. For example, an etch is performed to selectively remove the exposed portions of the second hard mask layer 144 as shown in FIG. 1d. The stools and the patterned second mask layers 142b and 144a, as shown in FIG. 1d, correspond to a hard mask stack structure 155. For simplicity and for illustration purpose, the hard mask stack structures include square or rectangular shape. However, it is understood that the hard mask stack structures may include square shape with rounded corners due to etching. Other suitable shapes may also be useful.

Referring to FIG. 1e, the patterned second hard mask layer 144a is processed. In one embodiment, a pull-back or a trimming process is performed on the patterned second hard mask layer. The pull-back or trimming process is performed to partially remove a portion of the second hard mask layer of the hard mask stack structures. The pull-back process, in one embodiment, includes an isotropic etch, such as a wet etch. Other suitable types of pull-back or trimming process may also be useful, depending on the material of the second hard mask layer. The pull-back process at least partially reduces or shrinks the width or diameter of the second hard mask layer of the hard mask stack structures. For example, the pull-back process reduces the dimension of the second hard mask layer from a first dimension (e.g., F1 as shown in FIG. 1d which is the same as the second $CD_s$) to a second dimension (e.g., F2 as shown in FIG. 1e). F2, for example, is about a few hundred nm to several nm. Other suitable dimensions may also be useful, depending on technology node.

As described, the second hard mask layer 144 is formed of a second material which the first material of the first hard mask layer can be etched with selectivity to it. As such, the stool 142b protects the underlying second hard mask layer during the trimming process. For example, the presence of the patterned first hard mask layer or stool protects top portion of the second hard mask layer during the trimming process. This avoids loss in height and damage to the shape and surface profile of the second hard mask layer. Maintaining the profile of the trimmed second hard mask layer 144b allows uniform width or diameter of contact holes to be formed later.

The process continues to remove the remaining first hard mask or stools 142b as shown in FIG. 1f. The remaining stools are removed by wet etch. In one embodiment, the stool, which is formed of SiN, is removed using a high silicon nitride etch rate recipe. Other suitable chemistries for removing the stool may also be useful, depending on the material used for the first hard mask layer. The removal of the stools exposes the trimmed second hard mask 144b. The trimmed second hard mask 144b may also be referred to as hard mask posts. For simplicity and for illustration purpose, the second hard mask posts 144b include square or rectangular shape. Other suitable shapes may also be useful.

Referring to FIG. 1g, a fourth hard mask layer 172 is deposited on the substrate, covering the third hard mask layer 146 and the second hard mask posts 144b. In one embodiment, the fourth hard mask layer includes a fourth material having etch selectivity with the third hard mask layer and the second hard mask posts. The fourth material, in one embodiment, includes nitride, such as but not limited to SiN. The fourth hard mask layer may include other suitable types of material. For example, the fourth hard mask layer may be formed of any type of material which can be removed selectively to the second hard mask posts and third hard mask layer. The fourth hard mask layer is formed by, for example, CVD. Other suitable techniques may also be employed to form the fourth hard mask layer. In a preferred embodiment, the fourth and first materials are the same. For example, the fourth hard mask layer is formed of the same material as the first hard mask layer. Providing first and fourth hard mask layers which are different may also be useful.

In FIG. 1g, a planarization process is performed on the substrate. The planarization process removes a portion of the fourth hard mask layer. The planarization process stops until top surface of the second hard mask posts is exposed. This, for example, produces a substantially planar surface between the second hard mask posts 144b and the fourth hard mask layer 172. The planarization process, in one embodiment, includes CMP. Other suitable types of planarization techniques may also be useful.

The process continues to form high density of small size openings 182 which extend from the top of the fourth hard mask layer to the first dielectric layer 120 as shown in FIG. 1h. In one embodiment, the exposed second material of the second hard mask posts and portions of the third hard mask layer as well as first dielectric layer not covered by the fourth hard mask layer are removed by multiple etch processes. Thus, the fourth hard mask layer serves as an etch mask. The multiple etch processes, for example, include an anisotropic etch, such as RIE. The RIE process may remove the exposed second and third hard mask layers and first dielectric layer using different etch chemistries. For example, the exposed second hard mask posts which include oxide material are removed by fluorine based chemistry, the third hard mask layer which includes APF is removed by an oxygen based chemistry while the exposed first dielectric layer which includes oxide material is removed using fluorine based chemistry. In other embodiments, different etch chemistries may be used, depending on the materials of the second and third hard mask layers and first dielectric layer. The multiple etch processes stop until top surface of the substrate 101 is reached. As shown, small openings 182 with vertical or substantially vertical sidewalls are formed. The openings, in one embodiment, include a size which is about the same as F2 of the second hard mask posts.

The process continues to remove the remaining third and fourth hard mask layers as shown in FIG. 1i. For example, the remaining third and fourth hard mask layers are removed by wet etch. As shown, high density array of contact holes or via openings 184 having size or diameter smaller than that achievable by capability of lithography system are defined in the first dielectric layer 120.

A conductive layer is deposited on the first dielectric layer, filling the high density contact hole array and covering the first dielectric layer. In one embodiment, the conductive layer includes conductive material such as tungsten. Other suitable types of conductive materials, such as copper and aluminum, are also useful. The conductive material, for example, may be formed by sputtering. Other suitable techniques may also be useful to form the conductive layer. Excess conductive materials over the substrate are removed to form via contacts 190 in the contact holes. In one embodiment, CMP is used to remove the excess conductive material, using the first dielectric layer as a CMP stop. This produces a substantially planar top surface. For example, the top surfaces of the via contacts and first dielectric layer are coplanar as shown in FIG. 1j. This completes formation of high density contact array. The via contacts, for example, connect the contact regions, such as gates and S/D regions of transistors to other devices or conductive interconnects (not shown) of an interconnect or metal level disposed above the first dielectric layer later.

The process may continue to form other devices over the first dielectric layer. In one implementation, the process may continue to form magnetic random access memory (MRAM) devices over the first dielectric layer 120 as will be illustrated with respect to FIGS. 3a-3c below.

In one embodiment, the process may continue to deposit various layers which are used for forming the MRAM devices. The various layers which are used to form the MRAM devices may be referred to as memory stack layers. For example, the process may continue to form magnetic tunnel junction (MTJ) stack layers. The MTJ stack layers, for example, include at least a magnetically fixed (pinned) layer, a tunnel barrier layer and a magnetically free layer. The MTJ stack layers may include other suitable layers. The various memory stack layers may be formed over the first dielectric layer by CVD. Other suitable materials and techniques may also be employed.

Figure 3A:
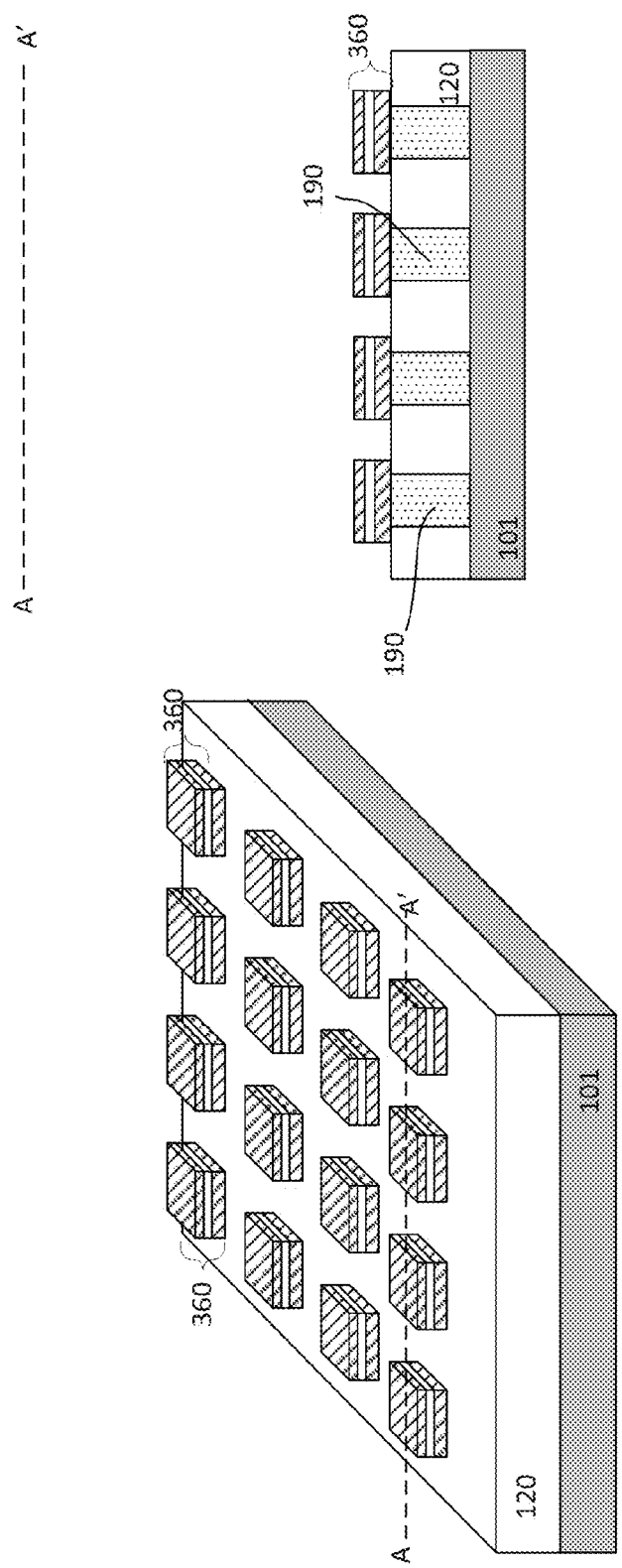

The process continues to form high density array of MTJ structures 360 as shown in FIG. 3a. The high density array of MTJ structures 360, in one embodiment, are achieved using the same double patterning technique which has been described in FIGS. 2a-2d. As such, the double patterning processing steps will not be repeated herein.

The high density array of MTJ structures 360 are formed on top of the first dielectric layer 120 and are coupled to the high density array of via contacts 190. The high density array of via contacts 190 in the first dielectric layer, for example, serve as lower electrodes which are coupled to the MTJ structures. Although MTJ structures 360 are shown as an example, it is understood that other suitable types of devices may be coupled to the high density array of via contacts.

Figure 3B:
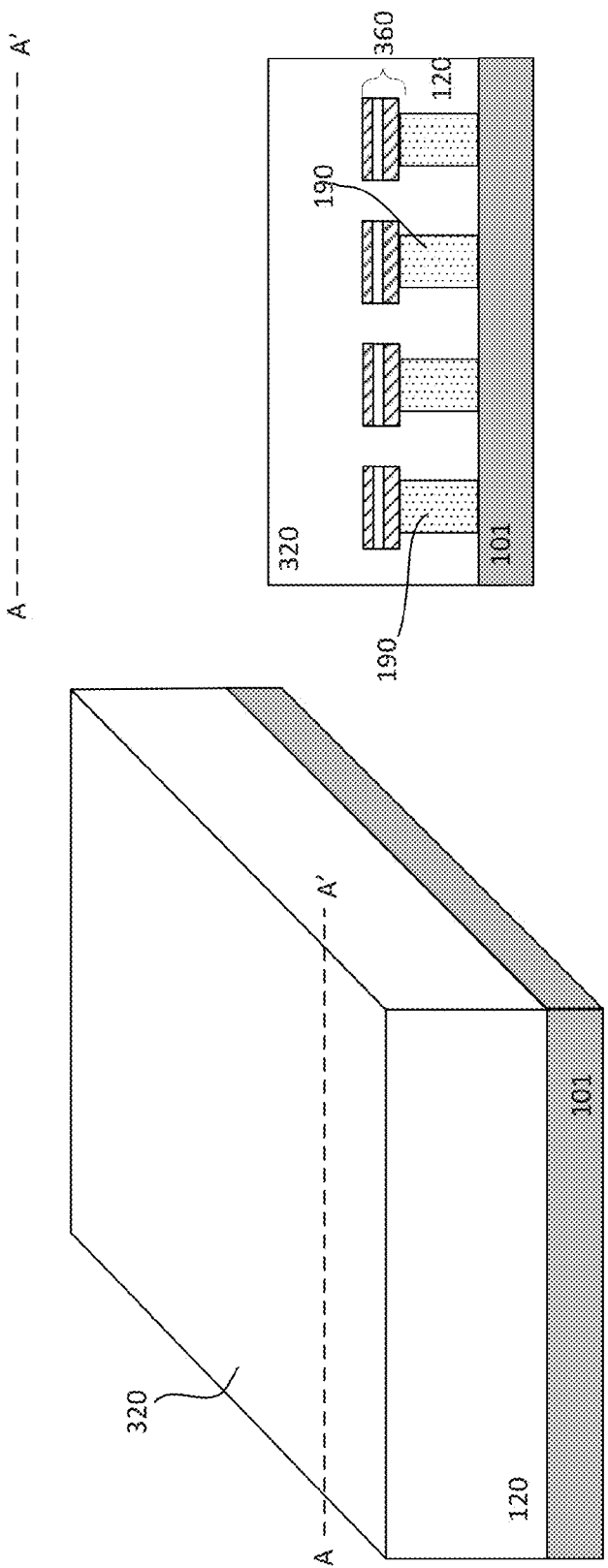

Referring to FIG. 3b, a second dielectric layer 320 is deposited on the substrate, covering the first dielectric layer 120 and high density array of MTJ structures 360. In one embodiment, the second dielectric layer may include the same material as the first dielectric layer. For example, the second dielectric layer is formed of silicon oxide. Other suitable types of dielectric materials may also be useful. The second dielectric layer may include other types of material which is different than the material of the first dielectric layer. In one embodiment, the second dielectric layer is formed by CVD or PVD. Other suitable techniques may also be employed to form the second dielectric layer.

A planarization process is performed on the substrate. The planarization process removes a portion of the second dielectric layer. This, for example, produces a top planar surface for the second dielectric layer. The planarization process, in one embodiment, includes CMP. Other suitable types of planarization processes may also be useful.

In one embodiment, high density array of via contacts 390 are formed in the second dielectric layer 320 as shown in FIG. 3c. The high density array of via contacts in the second dielectric layer, for example, serve as upper electrodes which are coupled to the MTJ structures. The upper electrodes 390, in one embodiment, are formed by performing the process steps illustrated in FIGS. 1a-1j until upper electrodes are formed. As such, details for forming the upper electrodes will not be described or described in detail.

The process continues to complete fabricating the IC. For example, the process continues with additional processing to form interconnects, additional interconnect levels, passivation layer, dicing, assembly and packaging. Other suitable processes may also be included to complete fabricating the IC.

The process as described above results in advantages. For example, the process enables contact holes with size well beyond lithography process capability to be formed. In addition, the process as described dramatically reduces the pitch size, thus allowing for high density array of contact holes to be formed.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming high density contact array comprising:
   providing a first dielectric layer;
   forming a hard mask stack over the first dielectric layer, wherein the hard mask stack comprises first, second and third hard mask layers having materials with mutual etch selectivity with each other and wherein the third hard mask layer is formed over the first dielectric layer while the second hard mask layer is formed in between the first and third hard mask layers;
   processing the first and second hard mask layers to form high density array of hard mask stack structures by performing a double patterning process, wherein the hard mask stack structures include patterned first and second hard mask layers having a first width F1;
   reducing the width of the patterned second hard mask layers to a second width F2 to form high density array of hard mask posts;
   forming a fourth hard mask layer over the third hard mask layer and surrounding the hard mask posts; and
   removing the hard mask posts and portions of the third hard mask layer and first dielectric layer underlying the hard mask posts to form high density contact hole array.

2. The method of claim 1 wherein the first and fourth hard mask layers comprise nitride material, the second hard mask layer comprises oxide material and the third hard mask layer comprises advanced patterning film.

3. The method of claim 1 wherein performing the double patterning process comprises:
   providing a first patterned resist mask on top of the first hard mask layer;
   performing a first etch to remove exposed portions of the first hard mask layer unprotected by the first patterned resist mask, wherein the first etch forms a patterned first hard mask having first line features separated by first spaces;
   removing the first patterned resist mask;
   providing a second patterned resist mask on top of the patterned first hard mask; and
   performing a second etch to remove exposed portions of the patterned first hard mask unprotected by the second patterned resist mask, wherein the second etch forms second line features which sever the first spaces into second spaces.

4. The method of claim 3 wherein the first and second etch comprise anisotropic etch and are highly selective to material of the first hard mask layer.

5. The method of claim 3 wherein the first patterned resist mask is provided by:
   forming a first photoresist layer over the first hard mask layer; and
   exposing the first photoresist layer by a lithographic system using a first reticle having a desired pattern.

6. The method of claim 5 wherein the first line features are trenches which expose the second hard mask below while the first spaces are unremoved portions of the first hard mask layer after performing the first etch.

7. The method of claim 6 wherein a width of the first line feature is defined as a first feature critical dimension ($CD_f$) while a width of the first space is defined as a first space critical dimension ($CD_s$) and the sum of $CD_f$ and $CD_s$ is equal to a pitch P1.

8. The method of claim 7 wherein the second patterned resist mask is provided by:
   forming a second photoresist layer over the patterned first hard mask; and
   exposing the second photoresist layer by a lithographic system using a second reticle having a desired pattern.

9. The method of claim 8 wherein the second reticle and the first reticle are the same reticle.

10. The method of claim 9 further comprising shifting the same reticle in first and second directions by a pre-determined amount prior to exposing the second photoresist layer.

11. The method of claim 10 wherein the same reticle is shifted ½ pitch in the first direction and ½ pitch in the second direction for exposure.

12. The method of claim 11 wherein the second etch forms second line features which sever each of the first spaces into four second spaces.

13. The method of claim 12 wherein a width of the second line feature has the same $CD_f$ as the first line feature while a width of the second space is defined as a second $CD_s$ which is smaller than the first $CD_s$ and the sum of $CD_f$ and the second $CD_s$ is equal to a pitch P2.

14. The method of claim 13 wherein P2 is equal to ½ of P1.

15. The method of claim 13 wherein reducing the width of the patterned second hard mask layer comprises performing a pull-back process to partially remove a portion of the second hard mask layer of the hard mask stack structure.

16. The method of claim 15 wherein the pull-back process comprises wet etch.

17. The method of claim 1 comprising filling the high density contact hole array with conductive material to form the high density contact array.

18. The method of claim 16 comprising forming high density array of magnetic tunnel junction (MTJ) structures on top of the first dielectric layer, wherein the MTJ structures are coupled to the high density contact array.

19. The method of claim 17 wherein the MTJ structures are formed by:
   depositing various MTJ stack layers over the first dielectric layer; and
   processing the various MTJ stack layers using double patterning process to form the MTJ structures.

20. The method of claim 18 comprising forming a second dielectric layer over the first dielectric layer and covers the MTJ structures.

* * * * *